United States Patent [19]

Mazur

[11] Patent Number: 5,204,840
[45] Date of Patent: Apr. 20, 1993

[54] MEANS AND METHODS FOR PRESERVING MICROPROCESSOR MEMORY

[76] Inventor: Jeffrey G. Mazur, 8041 Sadring Ave., Canoga Park, Calif. 91304

[21] Appl. No.: 391,096

[22] Filed: Aug. 8, 1989

[51] Int. Cl.$^5$ .................. G11C 5/14; G06F 12/14; G06F 12/16
[52] U.S. Cl. .................. 365/228; 365/229; 395/425; 364/DIG. 1; 364/969.4; 364/DIG. 2
[58] Field of Search .......... 364/200, 900, 969.4, 364/969.3; 365/226, 227, 228, 229

[56] References Cited

U.S. PATENT DOCUMENTS

| | | | |
|---|---|---|---|
| 4,578,774 | 3/1986 | Muller | 364/900 |
| 4,631,701 | 12/1986 | Kappeler et al. | 365/222 X |
| 4,718,038 | 1/1988 | Yoshida | 364/900 |
| 4,788,661 | 11/1988 | Morita | 365/228 X |
| 4,815,032 | 3/1989 | Fujii | 364/900 |
| 4,823,308 | 4/1989 | Knight | 364/900 |
| 4,897,631 | 1/1990 | Jundt et al. | 365/228 X |
| 4,901,283 | 2/1990 | Hanbury et al. | 365/222 |
| 4,959,774 | 9/1990 | Davis | 364/200 |
| 4,977,537 | 12/1990 | Dias et al. | 365/228 X |
| 5,018,096 | 5/1991 | Aoyama | 364/900 |

*Primary Examiner*—Alyssa H. Bowler

[57] ABSTRACT

Means and methods for preserving the RAM of an externally powered microprocessor on the occasion of a loss in external power. When the power loss is detected, a signal is generated which initiates a sequence to isolate the RAM and refresh it with an independent power supply. When main power is restored, the microprocessor is restored to its precise location at the moment of power loss. Shutdown, startup and security routines are provided by software embodied in the system.

5 Claims, 4 Drawing Sheets

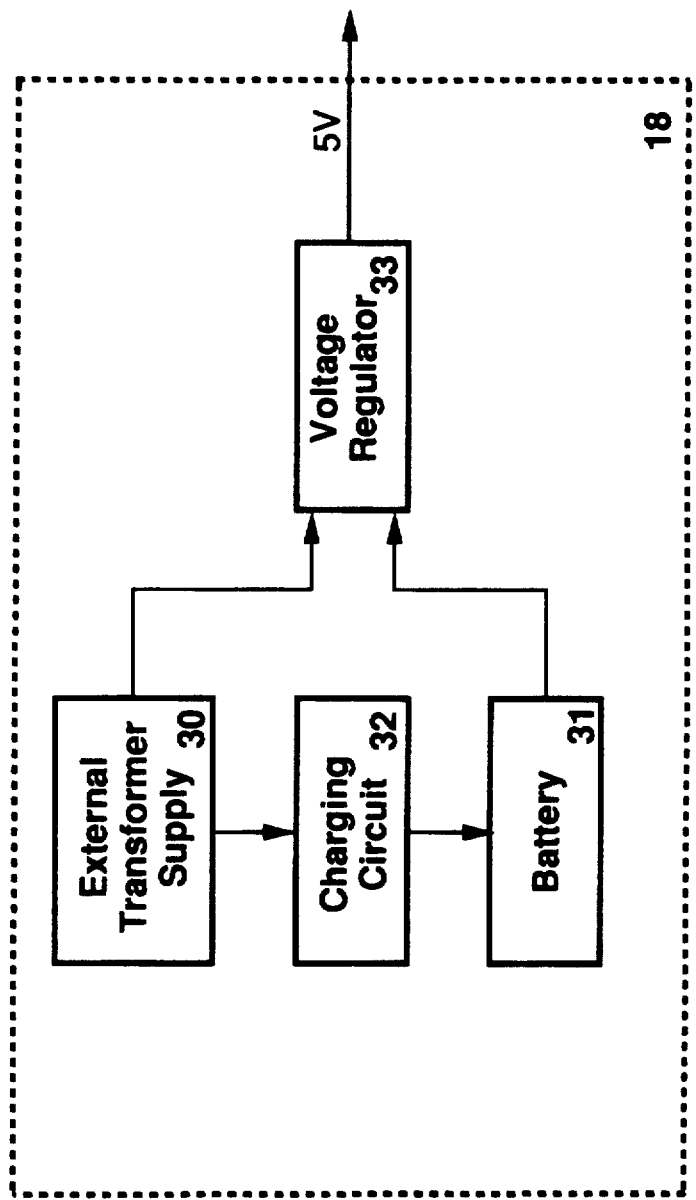

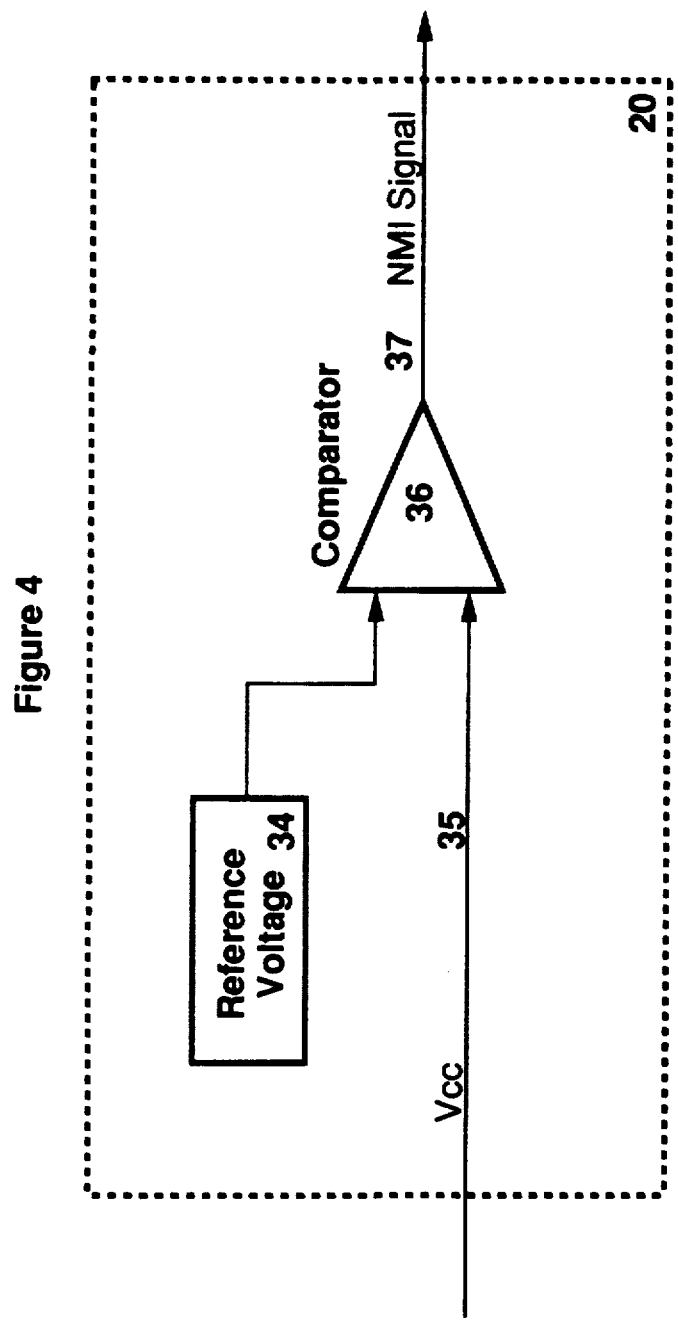

MEANS AND METHODS FOR PRESERVING MICROPROCESSOR MEMORY

INTRODUCTION

This invention relates generally to microcomputers and like devices which employ dedicated microprocessors and more particularly to means and methods for maintaining the status quo of the microprocessor and all device memory associated therewith when the electric power supplied thereto is either intentionally or unintentionally, diminished or is interrupted altogether.

BACKGROUND OF THE INVENTION

During the past ten to fifteen years microcomputers, and related devices have pervaded Western society and are commonplace throughout America. Indeed, it has been reported that one in seven American teenagers have access to their own microcomputer. The total number of microcomputers in use throughout the United States has been estimated to total more than 70 million.

The proliferation of microcomputer devices has been fueled in large part by dramatic cost reductions in the manufacture of integrated circuit chips, namely Dynamic Random Access Memory (DRAM) and in the production of Microprocessor (MPU) chips. Without low cost DRAM and MPU chips, the electronic explosion most likely would not have occurred.

MPU and DRAM chips, and all devices reliant thereupon, share a common vulnerability. These chips require a constant and uninterrupted supply of electric power to function properly. A power interruption of only a millisecond can cause such chips to lose all information programmed thereon and thus abort what could be a very valuable asset of a business enterprise.

The provision of uninterruptable power supplies to keep MPU and DRAM chips in action at a time when an external power source is interrupted is not practical in most applications. Large batteries and complex switching are required which violate the basic size and weight requirements inherent in most applications utilizing MPU and DRAM chips.

This vulnerability to imperceptible power outages affects not only the microcomputer, but those devices controlled or reliant upon MPU and/or DRAM chips. If, for example, a clothes or dishwasher is mechanically controlled, a five minute power outage is a minor inconvenience that the consumer may not even notice. When the power comes back on, the appliance continues with its cycle as if the interruption had not occurred.

Such is not the case with the new and improved computer controlled appliances where the loss of power to the DRAM and MPU assures that all information kept therein is lost. In such a case, the appliance will go to the "ready" or "abort" mode, and await fresh input. The interrupted cycle will not be completed. Further, the programmed cycles maintained in DRAM and the MPU will have to be reestablished in the device before it can be again usefully employed.

It is therefore apparent that a clear need exists for means and methods which will unequivocally preserve the information contained in DRAM and the microprocessor even though its power supply is interrupted and which will upon the restoration of the external power source, allow the device with which the DRAM and MPU are mounted to automatically restart its processing cycle at the precise point of interruption.

BRIEF SUMMARY OF THE INVENTION

At a system level, the means of the present invention comprise both hardware and software. The hardware comprises in coactive combination a power loss detection circuit, an independent power supply, a continuously rechargeable battery which is recharged by the independent power supply, a standby refresh circuit, a switch-over circuit, address and data busses, and an address control circuit, all of which are in addition to and augment the existing conventional computer circuits. The software used in combination with the hardware is capable, upon power fail detect, to copy all of the volatile data stored in the microprocessor and deliver it to nonvolatile storage. Upon subsequent power-up, the normal reboot sequence is aborted and the data held in the nonvolatile storage is copied back to the microprocessor which creates an "instant-on" system, that is, the user is returned to where he left the machine when power was lost.

In operation, the means and methods of the present invention back up the dynamic RAM memory of the associated computer system in the event of a power loss or outage. In addition, the present invention preserves the status of the machine and upon resumption of the principal power source, restores the machine to the precise place it was at the moment of the power loss or outage. Furthermore, means are provided which maintain the security of the data and password protect the computer after restoration of original power.

The prior art has heretofore dealt with the problems created for static random access memory ("SRAM") when the power source fails. None have successfully transferred the protective concept to the management and protection of the dynamic RAM (DRAM). It is toward this goal that the present invention is directed.

Accordingly a prime object of the present invention is to provide new and unique means and methods for placing a computer in "suspended animation" during the course of a loss or interruption of external power and for causing it to restart when the external power is restored without any loss of information originally contained in DRAM or the computer's microprocessor.

Another object of the present invention is to provide new and improved means which allow a microcomputer to restart after a power interruption without requiring a reset or reboot process.

A further object of the present invention is to provide new and improved means which allow a computer to be turned off and on, and to thereafter resume operation as if the power interruption had never occurred.

These and still further objects of the present invention as shall hereinafter appear, are fulfilled by the present invention in a remarkably unexpected fashion as can be readily discerned from a careful consideration of the following description of the preferred embodiments thereof especially when read in conjunction with the accompanying drawing in which like parts bear like indicia throughout the several views.

BRIEF DESCRIPTION OF THE DRAWING

In the drawing:

FIG. 3 is a block diagram of the power supply of the embodiment of FIG. 1; and

FIG. 4 is a block diagram of the power fail detector of the embodiment of FIG. 1.

DESCRIPTION OF THE PREFERRED EMBODIMENT

Figure 1:
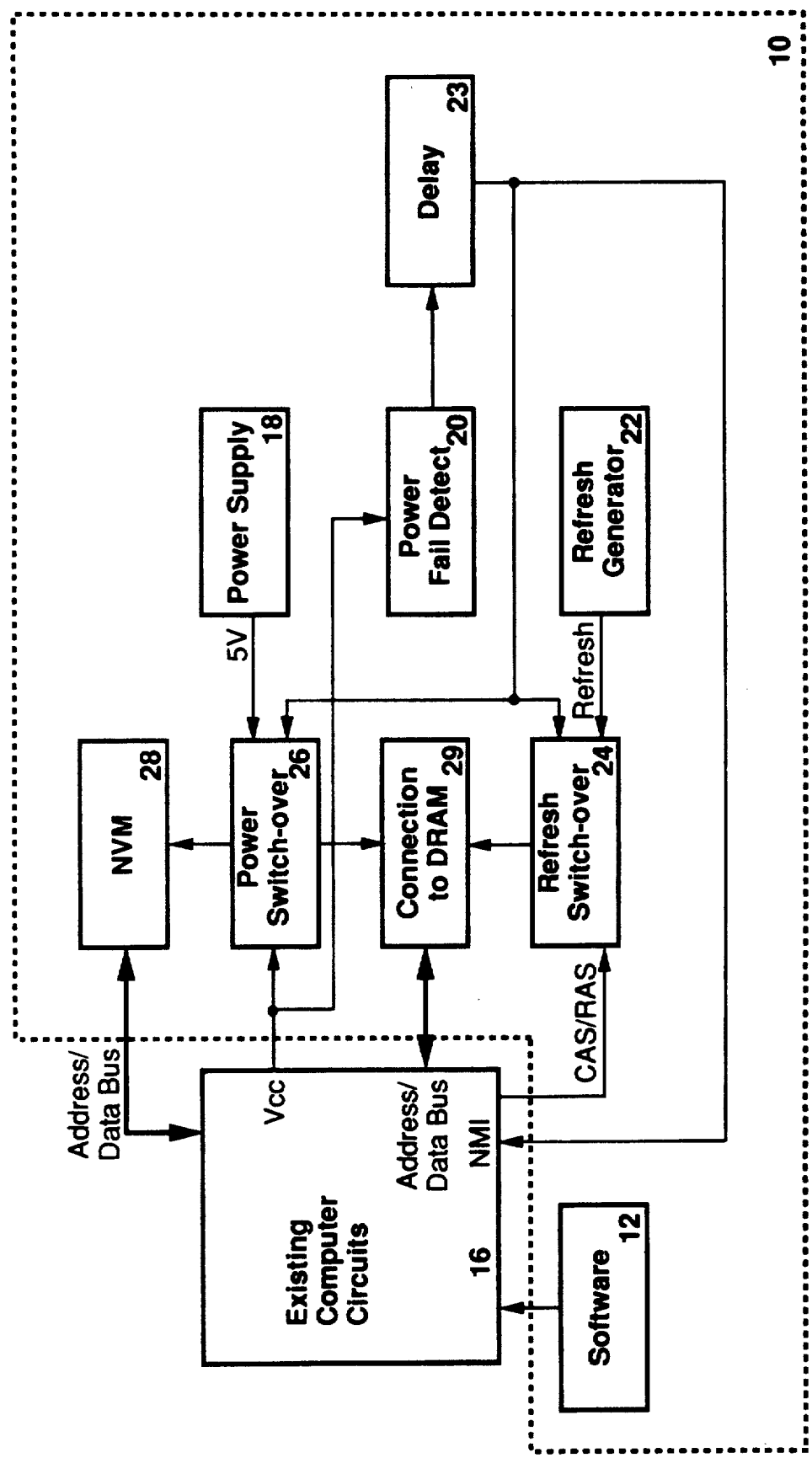
FIG. 1 shows a functional block diagram of a system embodying the present invention.

In practice, the means and methods embodying the present invention function as follows. When the power loss detection circuit senses a significant undervoltage from the external power source relative to a preselected reference voltage value, the device hereof will automatically switch from a passive mode to an active mode and send a signal to the computer microprocessor directing it to follow a novel and unique shutdown routine with which it has been specifically programmed. After the microprocessor completes the shutdown routine, the microprocessor is essentially placed in suspended animation. The typical gyrations followed by a microprocessor as it loses power do not affect the stored memory as the DRAM is isolated from the MPU switching circuitry. The states and pointers of the microprocessor are recorded in a portion of the replacement DRAM which allows all of the information contained in the microprocessor and DRAM at the time of the power loss to be preserved.

The standby refresh circuit in the novel system will continue to refresh the replacement DRAM for the duration of the external power source interruption. Such interruption can persist for an indefinite period of time if the device is on external power. If both the device and computer have lost power, the refresh can be continued for as long as its associated battery holds out. Current batteries possess sufficient power to maintain the memory in "suspended animation" for eight hours or more.

When external power is restored to the computer, the device embodying the present invention will direct the microprocessor to follow a special preprogrammed restart procedure and resume operating as if the power interruption had never happened. All of the microprocessor states and pointers are restored to the status quo ante. When the voltage equals the preselected reference value, the microprocessor is reenabled, and the microcomputer resumes normal operations. To the user, the restart of the microcomputer is essentially instantaneous after power has been restored.

Referring to the drawing, a memory preserving system embodying the present invention, is identified by the general reference numeral 10. As shown in FIG. 50 each system 10 comprises software means 12 associated with hardware means, each of which are more fully described below. System 10, when operable, is coactively connected to a computer 16 which may contain a microprocessing unit ("MPU") or a full board processor.

The hardware hereof comprises independent power supply means 18, power-loss detection circuit 20, refresh generator 22, a refresh switch-over circuit 24, a power switch-over circuit 26, a non-volatile memory ("NVM") 28, and memory connection means 29 connected to the dynamic RAM of computer 16, each of which operatively interact with each other and coact with software means 12 to allow the system 10 to perform its intended function as will now be more fully described. The term "non-volatile memory" as used herein includes such known memory elements as static RAM, erasable programmable ROM ("EPROM") and electrically erasable programmable ROM ("EEPROM").

Power supply means 18, as shown in FIG. 3, includes an external transformer power source 30, rechargeable battery 31, battery charging circuit 32, and a voltage regulator 33. Charging circuit 32 acts continuously to recharge battery 31 so long as the hardware receives electricity from external power source 30. Power loss detection circuit 20, as shown in FIG. 4, comprises a precision reference voltage 34, an input voltage 35, and a comparator 36. When input voltage 35 falls below the value set for reference voltage 34, as determined by the comparator 36, a NMI signal 37 is sent to computer 16, to a delay 23, then to refresh switch-over circuit 24 signifying the voltage drop. Delay 23 is an I.C. circuit that delays the signal by about one millisecond. Such circuits are well known. Once refresh switch-over circuit 24 has been notified of the voltage drop, circuit 24 switches the DRAM of computer 16 to receive its DRAM refresh signal from refresh generator 22 rather than from within computer 16 (which signal was dependent on the power whose failure was detected). The refresh signals delivered by refresh generator 22 to the DRAM of computer 16 are synchronized to the computer's normal refresh signal by a synchronization circuit which is a part of refresh switch-over circuit 24. Refresh switch-over circuit 24 also acts to isolate the DRAM of the computer 16 from the computer device 16 per se so that none of the information maintained and retained in the DRAM is corrupted during the shut down and restart of computer 16. The refresh generator 22 insures that the information in the DRAM is maintained as it was at the last moment of normal operation of computer 16 so long as power is received from power supply 18.

Figure 2:
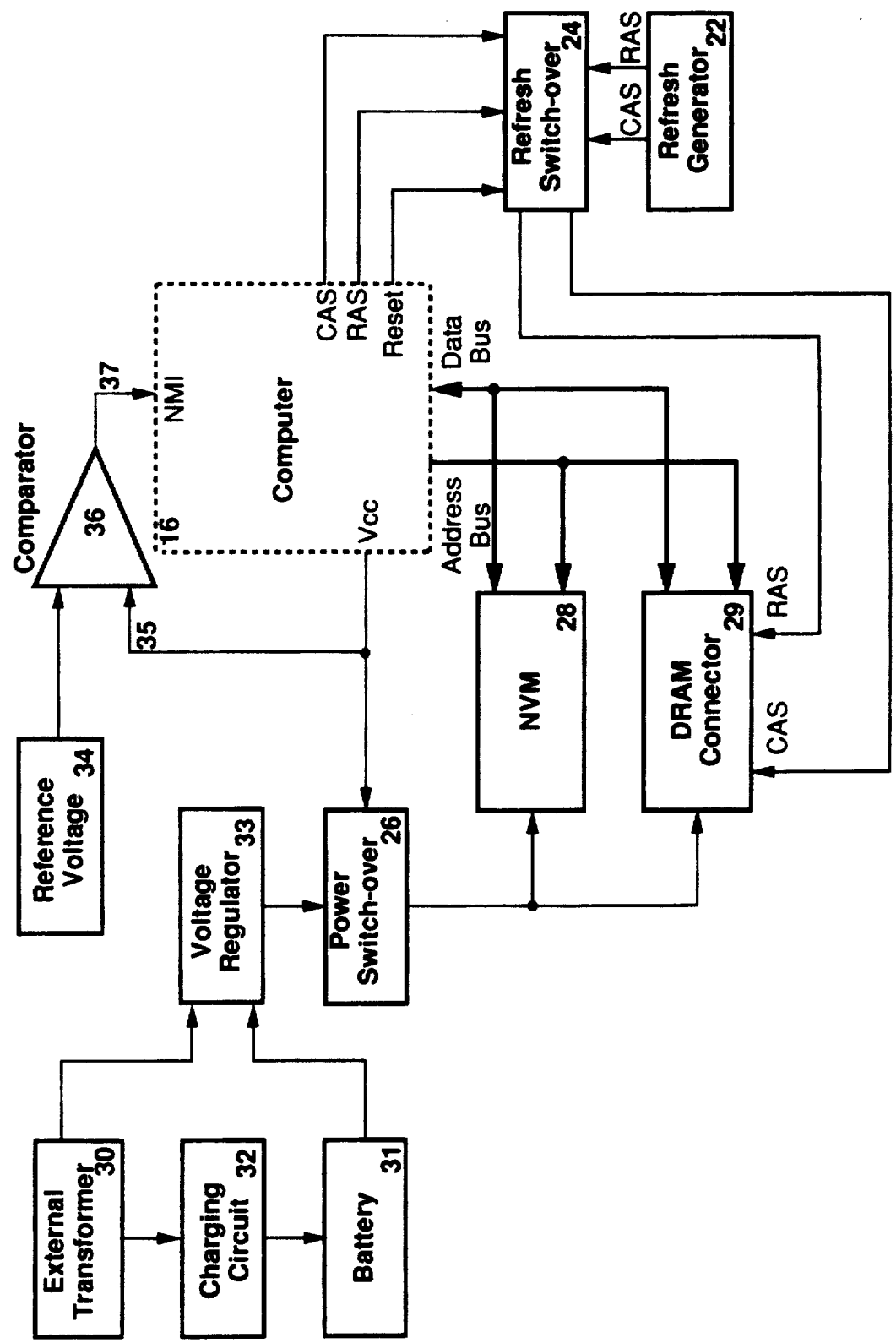
FIG. 2 is a more detailed block diagram of the embodiment of FIG. 1.

Referring now to FIG. 2 which shows a block diagram of system 10 when it is configured for use with a MACINTOSH SE computer (Apple Computer Corp., Cuppertino, Calif.). Because the hardware must precisely interact with the computer 16 on which it is installed, both software means 12 and the associated hardware will require some modification to render it compatible with the device for which use of system 10 is intended. However, as will appear, the basic concept of the system as shown herein is equally applicable to all such computer devices with which the system 10 may be installed. The MACINTOSH SE is referred to herein merely to exemplify the invention.

In one embodiment hereof, power supply means 18 comprises an external transformer supply 30, a rechargeable battery 31, a battery charging circuit 32, and voltage regulator 33. When the computer 16 is on, the voltage to system 10 and the DRAM is supplied by the computer's internal power circuit. When the computer 16 is turned off, unplugged, or otherwise loses its power, the requisite voltage to operate system 10 and refresh DRAM is instantaneously delivered by transformer 30. Should transformer 30 lose power, the DRAM will forthwith receive its maintenance voltage from battery 31. Battery 31 is preferably nickel-cadmium but any battery known to the art to be rechargeable can be used. The voltage delivered to system 10 and the DRAM by either transformer supply 30 or battery 31 will be regulated through a voltage regulator 33.

As shown in FIG. 2, refresh generator 22 comprises an oscillator which produces pulses of a preselected repetition rate and duration to refresh the DRAM supported by system 10.

In installing system 20 into a microcomputer 16, for example, a MACINTOSH SE, the DRAM is removed from the computer and placed on an auxiliary circuit board (not shown) upon which system 10 is mounted. Typical installation involves conventional SIMM sockets which for all functions except column address select ("CAS"), row address select ("RAS") and supply voltage (Vcc), couple the computer generated signals to the DRAM. The CAS, RAS and Vcc signals will originate with the computer 16 when the computer's power supply is functioning correctly and from system 10 when a power lapse has occurred.

A variety of schemes exist for storing the software 12 within the system 10. For example, when a MACINTOSH SE is in its startup mode, it looks for a hook at address $F80000. NVM 28 of the system 10 is located at address $F80000 and up. A special program is executed to place a program in the NVM. The code contained therein interrupts the normal restart procedure for the MACINTOSH and the software 12 substitutes itself for the normal restart routines. After restart is accomplished, the software 12 allows the MACINTOSH to continue running the application software from the point of interruption.

The code in the NVM also controls the power-fail routine.

Synchronization means 38 in the refresh switch-over circuit 24 acts to synchronize refresh generator 22 with the refresh pulses generated by the MACINTOSH. This is necessary so that all DRAM are properly refreshed when the system 10 is activated by power loss detection circuit 20.

In practice with MACINTOSH SE, a fall of the supply voltage below 4.8 V will be sensed by power fail detection circuit 20 which activates a one shot delay generator to produce a six hundred micro second delay. If at the end of the delay, the incoming voltage to the computer 16 is still below the precision reference voltage 34, e.g., 4.8 V, as measured by loss detector 20, a non-maskable interrupt ("NMI") signal is generated. The use of the micro second delay avoids false triggering due to "glitches". The NMI signal then causes the shutdown portion of the software 12 to be run. The low voltage measurement also activates refresh switch-over means circuit 24 via delay 23 to immediately direct refresh signals to the DRAM from the refresh generator 22, circumventing the principal computer. The entire computer 16 is placed in suspended animation until such time as the computer supply voltage rises above the preselected precision voltage reference, e.g., 4.8 V, as measured by power fail detection circuit 20.

When the power supply to the computer 16 is restored, the computer 16 initiates the execution of the start-up routine of software 12 and the refresh signals to the DRAM are again generated by the computer 16, instead of by refresh generator 22. The computer 16 then begins to run the applications software at the exact place where it left off when power went down.

As appears above, the system 10 of the present invention enables the Dynamic RAM of the computer to be saved even when the power supply voltage of the computer reaches 0. The system thus preserves all of the main memory of the computer as well as the internal memory of the microprocessor during the power interruption.

As previously explained, the software 12 can include four functional routines, namely, the installation program (or code), the shutdown routine (or code), the restart routine (or code) and the security routine (or code). These routines will now be described in further detail.

The installation program is run every time the computer is rebooted. This program installs the shutdown routine (or code) and the restart routine (or code) into the NVM 28 disposed on the system board 10. It also changes the NMI vector so that the vector now points to the shutdown code. As will appear, the restart code is installed in such a way that it is automatically executed upon restart of the computer. Note that in a perfect world, the installation program will be run only once, because system 10 obviates the need to reboot the computer ever again.

The second aspect of software 12 is the shutdown code. The computer's NMI vector is set to point to this code as explained above. Thus, when an NMI is received, the shutdown code is immediately executed. Upon execution, the code saves the contents of the registers in the MPU, saves the VIA registers, calculates a checksum of a portion of memory, and then saves the checksum. This has the effect of saving the status of all volatile memory which had been in the computer (the DRAM is no longer volatile because of the operation of system 10). The code then places a special "signature" word on the stack to indicate that it (the code) has been run.

The third aspect of software 12 is the restart code. Upon re-application of power, computer 16 starts to reboot. Early in the reboot code, it checks to see if there is a "magic" flag at location $F80000. If this flag is present, the code pointed to by the data at $F80004 is executed. When the installation program is run, it places the flag at $F80000, and the address of the restart code at $F80004. Because of this, the restart code is executed whenever power is restored. The restart code checks to see if the special signature word is present on the stack. If it is not, the code assumes that the user wants to reboot computer 16 and obligingly reboots the machine. However, if there is a special code or signature on the stack this will indicate that the computer was interrupted. In this case, rebooting will not occur. Instead, software 12 simply restores computer 16 to the status it was in when power loss occurred. If a secret mode is implemented, then restoration is back into the middle of the security code. The code then re-calculates the memory checksum and compares it with the saved value. If they are not equal, the machine is rebooted. The code then restores the registers of the MPU and VIA. This has the effect of restoring the computer to virtually its exact state at the moment the power failed.

The fourth aspect of software 12 which is optional, is the security code. The security code actually consists of two parts, namely, one which is a utility which allows the user to set a password to prevent unauthorized access to his machine. The password is encrypted and stored in SRAM 28 of system 10. This utility also allows the user to set a delay time to allow his hard drive to come up to speed.

The second part of the security code is a desk accessory (DA) which activates the security feature. DA's are programs which can be activated in the middle of another program. The DA in system 10 allows the user to turn off his computer with security activated. When power is restored, the DA prevents access to the computer until the correct password has been entered. At this time the screen is preferably blackened to prevent unwanted observation. The programmer's interrupt switch is disabled, and reset has been circumvented, so there is no way to access the computer without entering the correct password.

In the preferred practice of the present invention, all the circuitry herein described and illustrated in the description of system 10, with the exception of batteries 31, can be mounted on a single circuit board which is installable within computer 16 in the same manner as any auxiliary circuit board is currently installed. When space constrictions do not allow a single board, system 10 can be disposed on a plurality of boards, the actual placement and disposition of the several increments being with the skill of the art and not material to the unique functioning of the described system.

From the foregoing, it becomes apparent that new and useful procedures have been herein described and illustrated which fulfill all of the aforestated objectives in a remarkably unexpected fashion. It is of course understood that such modifications, alterations and adaptations as may readily occur to an artisan having the ordinary skills to which this invention pertains are intended within the spirit of the present invention which is limited only by the scope of the claims appended hereto.

Accordingly, what is claimed is:

1. A system for preserving at least the main random access memory ("RAM") of a computer system having a power supply on the occasion of a sudden loss in power, said system comprising:

a power loss detection circuit adapted to sense a loss in the power supply of said computer system and emit a signal causing a switch-over circuit to isolate at least said main RAM from the computer system and cause at least said main RAM to receive its power from an independent power source; and a power switch-over circuit responsive to said power loss detection signal to connect said independent power source to said memory; and an independent power supply comprising an external transformer power supply, a rechargeable battery, a voltage regulator, and a battery charging circuit connected to said battery, said transformer power supply being connected to said voltage regulator and to said battery charging circuit, said battery being connected to said voltage regulator for delivery of power to said switch-over circuit; and a power-fall detection circuit comprising a precision voltage reference, means for measuring the input voltage to said computer system, and a comparator for initiating an NMI alert signal when said measured input voltage falls below said precision voltage reference; and software operatively associated therewith and responsive to said power loss detection circuit signal to initiate a shutdown routine when said signal is activated and to initiate a restart routine when said signal is deactivated; and security means for interrupting a normal startup sequence of said computer system to invoke a security procedure, whereby further use of said computer system would be allowed only after identifying an authorized user.

2. The system of claim 1 wherein said security means includes a startup detection circuit which connects to said computer system, which detects execution of the startup sequence and positively interrupts said startup sequence and instead executes a security routine.

3. The system of claim 2 wherein said security routine comprises software operatively associated therewith and responsive to said startup detection circuit to initiate a security routine when said startup sequence is detected and to allow the normal startup sequence to proceed only after properly identifying an authorized user.

4. The system of claim 1 wherein said security means includes nonvolatile memory to store a security routine and/or user identification information.

5. The system of claim 3 wherein said security means includes hardware and/or software to operatively prevent any person from circumventing the function of the security means.

* * * * *